United States Patent [19]

Chang et al.

[11] 4,295,181
[45] Oct. 13, 1981

[54] MODULE FOR AN INTEGRATED CIRCUIT SYSTEM

[75] Inventors: Richard R. Chang, Richardson; Gene A. Frantz; William R. Hawkins, both of Lubbock, all of Tex.

[73] Assignee: Texas Instruments Incorporated, Dallas, Tex.

[21] Appl. No.: 3,449

[22] Filed: Jan. 15, 1979

[51] Int. Cl.³ .............................................. H05K 7/10
[52] U.S. Cl. .................................. 361/395; 361/394; 361/399; 361/403
[58] Field of Search ................ 361/403, 394, 395, 399

[56] References Cited

U.S. PATENT DOCUMENTS

| | | | |
|---|---|---|---|
| 3,297,074 | 1/1967 | Pittman | 361/403 X |
| 3,643,135 | 2/1972 | Devore | 361/394 |
| 3,652,974 | 3/1972 | Tems | 361/403 X |
| 3,701,077 | 10/1972 | Kelly | 361/403 X |
| 3,825,801 | 7/1974 | Beavitt | 361/403 |
| 3,911,328 | 10/1975 | Haury | 361/394 |
| 3,912,983 | 10/1975 | Lowry | 361/403 |
| 3,954,175 | 5/1976 | Mason | 361/403 X |
| 4,039,902 | 8/1977 | Lacan | 361/395 |
| 4,131,851 | 12/1978 | Martiny | 361/395 X |
| 4,149,027 | 4/1979 | Asher | 361/399 X |

*Primary Examiner*—Richard R. Kucia

*Attorney, Agent, or Firm*—Robert D. Marshall, Jr.; Leo N. Heiting; Melvin Sharp

[57] ABSTRACT

A module containing an integrated circuit, such as a read-only memory (ROM), includes an essentially box-shaped plastic housing having an internal chamber in which the integrated circuit is located. Positioned within the chamber is a printed circuit board on which the integrated circuit is mounted. Also mounted on the printed circuit board and adjacent to an elongated narrow slot located in one side of the housing are a plurality of electrical spring contacts electrically connected to the integrated circuit by means of electrical conductors on the printed circuit board. Upon insertion of the module into an electronic apparatus, edge connectors of a printed circuit board of the electronic apparatus extend through the narrow slot and engage the electrical spring contacts, thereby electrically connecting the integrated circuit to the apparatus. The module is designed so that its insertion into and removal from an electronic apparatus is by way of a receptacle which houses the battery power supply for the apparatus. This arrangement requires that the batteries be removed and thus the power disconnected, before the module is insertable into or removable from the apparatus to prevent damage to the integrated circuit from insertion with power on.

9 Claims, 6 Drawing Figures

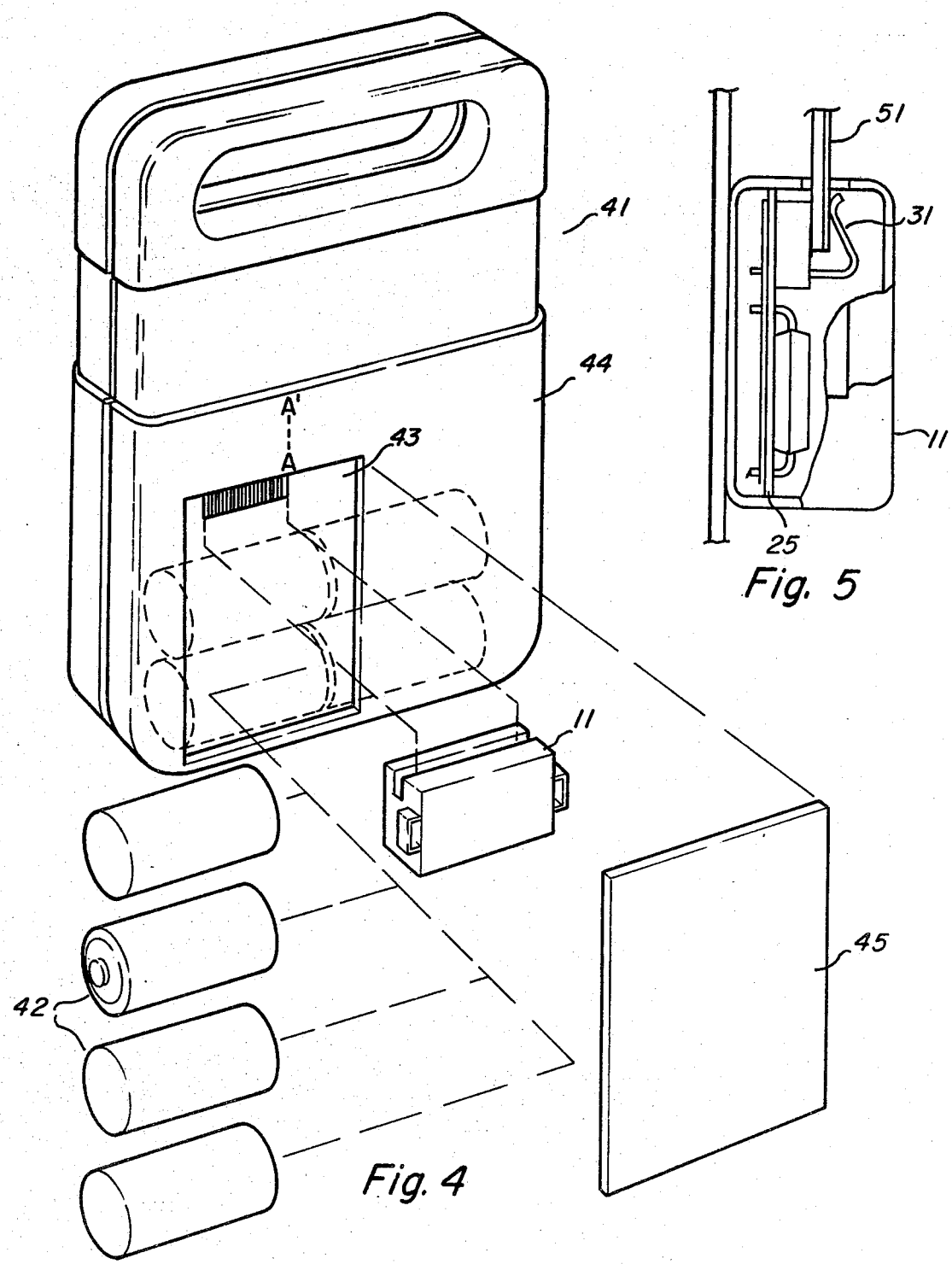

MODULE FOR AN INTEGRATED CIRCUIT SYSTEM

BACKGROUND OF THE INVENTION

This invention relates to modules containing integrated circuits and in particular to insertable modules for interchangeably coupling integrated circuits to electronic apparatus.

In the prior art, interchangeable electronic functions are provided by permitting the user of an electronic apparatus to plug an integrated cicuit package into a socket or the like in the apparatus. This technique is disadvantageous in that frequent insertion and removal of the integrated circuit by an untrained user increases the chance of damage thereto. Also, it is difficult to insure that the integrated circuit is properly positioned within the apparatus so as to preclude damage to the electrical contacts and leads.

An interchangeable module for integrated circuits is disclosed in allowed copending U.S. Pat. No. 4,216,522. The integrated circuit is contained in a module, which is inserted into an apparatus such as an electronic calculator. The module is designed so that the electrical contacts in the module do not touch the electrical contacts in the calculator until the module is properly positioned in the calculator. The module is inserted into a special compartment designed to accomodate the module within the calculator.

SUMMARY OF THE INVENTION

It is one object of the present invention to provide inexpensive modules for integrated circuit systems.

It is another object to provide modules for integrated circuit systems which provide positive contact between the electrical contacts of the module and those of a printed circuit board of an electronic apparatus in which the module is inserted without the need for bonding electrical contacts to the printed circuit board of the apparatus.

It is yet another object to provide modules for integrated circuit systems which are installed in and removed from an electronic apparatus only after the battery power supply for the apparatus has been disconnected.

It is a further object of the invention to provide a module for an integrated circuit system which is substantially unsusceptible to touching and tampering. It is still a further object to provide a module for an integrated circuit system which prevents damage to the integrated circuit from the electric potential carried by a user.

These and other objects are accomplished in accordance with the present invention by providing a module completely enclosing an integrated circuit in a protective housing, preferably of plastic material. The housing provides an internal chamber in which an insulative substrate, such as a printed circuit board (PCB), is positioned. The integrated circuit is preferably enclosed in a standard insulative package with connection leads emanating therefrom. The packaged integrated circuit is mounted on the PCB and is electrically coupled via its connection leads to respective conductors on the PCB. Also mounted on the PCB and adjacent to an elongated narrow slot located in one side of the housing are a plurality of electrical contacts such as spring contacts, which are electrically coupled to the integrated circuit by means of the conductors on the PCB. When the module is inserted in an electronic apparatus, the edge connector of a corresponding printed circuit board (PCB) of the apparatus is urged into the slot and into engagement with the spring contacts of the module, thereby electrically connecting the integrated circuit to the electronic apparatus. This arrangement provides positive contact between the contacts in the module and the PCB edge connector.

The module is designed for insertion into and removal from the apparatus only after the batteries have been removed and thus power disconnected, thereby preventing electrical connection of the module with power on, which could damage the integrated circuit. When the module is installed in the apparatus, its electrical components are inaccessible and therefore not susceptible to accidental damage due to touching or tampering such as by a child user. The module, however, is easily removable when necessary.

In a preferred embodiment, the module is comprised of upper and lower housing members, which snap together to form a protective housing for the integrated circuit located therein. Located on a first side wall of the housing is a slot which extends along the entire length of the first side surface and inwardly along portions of first and second end walls parallel to the upper and lower surfaces of the housing. Affixed to a second side wall oppositely positioned from the first side wall is an integral projection having a recessed portion therein whereby the module is engageable with a tool or other implement to facilitate installation in and removal from an electronic apparatus.

The module of the present invention is particularly well-suited for housing a read-only memory (ROM) for electronic learning aids such as the electronic spelling device described in copending U.S. patent application Ser. No. 901,395, which is assigned to Texas Instruments Incorporated, assignee of the present invention. To insert the module into the electronic spelling device, the cover for the battery compartment and the batteries therein are first removed. Next, the module is inserted into the device by way of the compartment. The edge connector of the PCB in the electronic spelling device extends through the narrow slot in the housing and engages the spring contacts mounted therein to connect the ROM to the device. Finally, the batteries and compartment cover are replaced and the device is ready to operate.

BRIEF DESCRIPTION OF THE DRAWINGS

Still further objects and advantages of the invention will be apparent from the detailed description and claims when read in conjunction with the accompanying drawings wherein:

FIG. 4 is a rear elevational view of an electronic spelling device with the battery compartment cover removed, showing the installation of the module and the batteries in the device; and FIG. 5 is a cross-sectional view of the interior of the module after the module has been inserted in an electronic apparatus.

DETAILED DESCRIPTION OF THE INVENTION

Figure 1A:
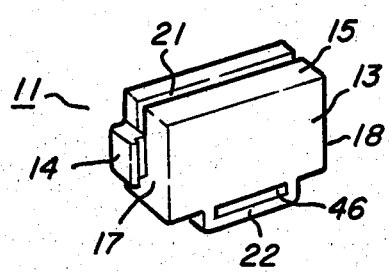
FIG. 1a is a bottom perspective view of the module of the present invention.
Figure 1B:
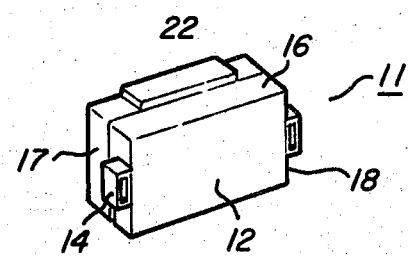
FIG. 1b is a top perspective view of the module.

Referring to FIGS. 1a and 1b, module 11 embodied in the present invention includes an essentially box-shaped housing, preferably of a plastic material. The housing is comprised of lower and upper housing members 23 and 24 (FIG. 3) having top and bottom major surfaces 12 and 13, respectively. Lower and upper housing members 23 and 24 are attached together by locking means 14 to form an internal chamber for housing an integrated circuit and/or other electronic components. The casing has two mutually parallel side walls 15 and 16, and two mutually parallel end walls 17 and 18, perpendicular to side walls 15 and 16. Extending along the entire length of side wall 15 and inwardly along portions of end walls 17 and 18 adjacent to side wall 15 is a relatively narrow elongated slot 21 which provides access by a PCB edge connector to the internal chamber. Side wall 16 has an integral projection 22 affixed thereto to facilitate insertion and extraction of the module by a tool or other implement and also to facilitate manual handling by a user.

Figure 2:
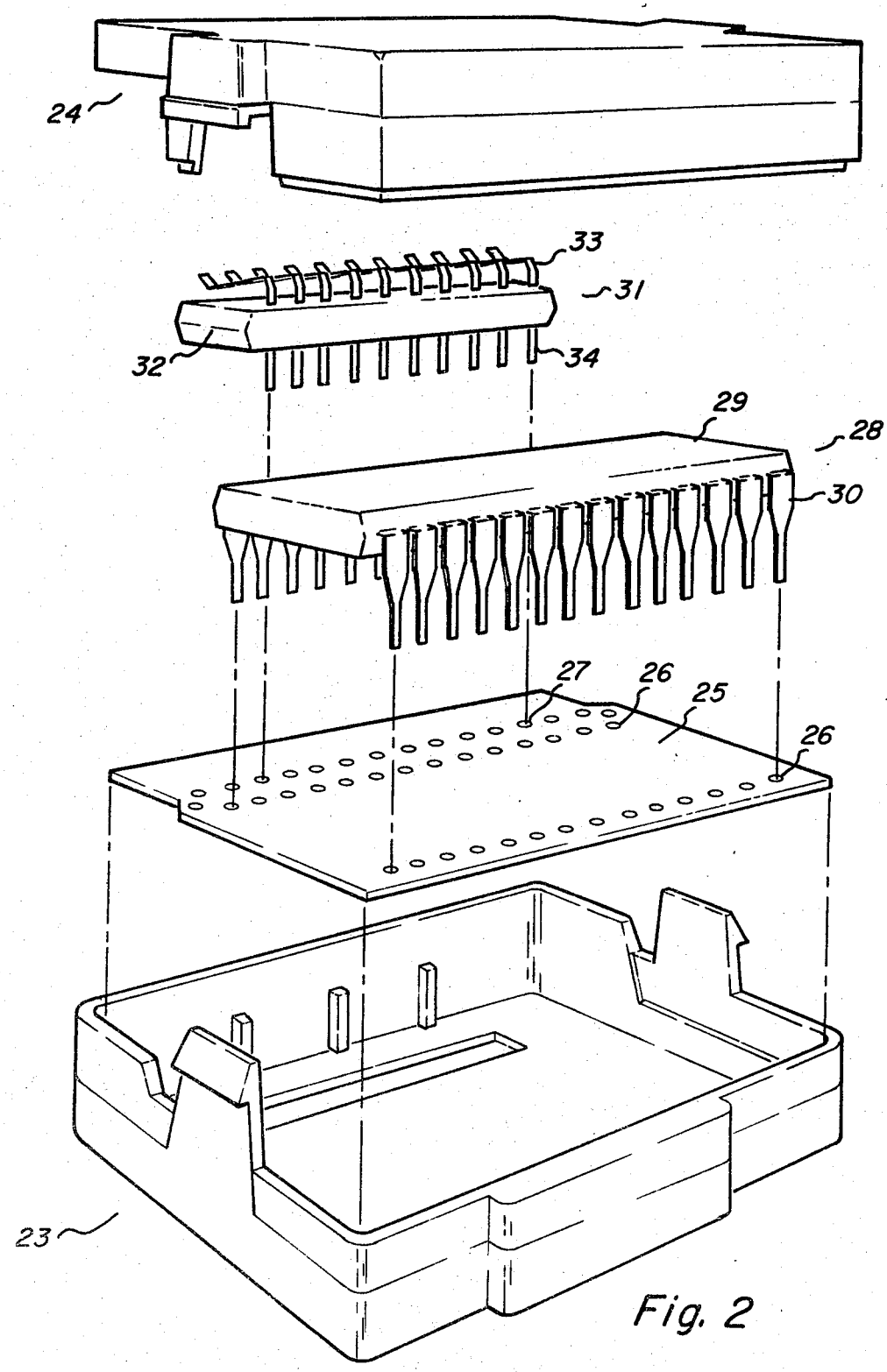
FIG. 2 is a perspective view of the various components of the module of FIG. 1.

The various components comprising module 11 are shown in FIG. 2. Positioned in lower housing member 23 is an insulative substrate 25, preferably a printed circuit board (PCB) with a plurality of electrical conductors (not shown) affixed thereto. Located on a major surface of substrate 25 are a first set of openings 26 and a second set of openings 27. An integrated circuit 28, preferably enclosed in an insulative integrated circuit package 29, has a plurality of connection leads 30 emanating therefrom for electrically connecting integrated circuit 28 to the electrical conductors on substrate 25. A plurality of electrical spring contacts 31 for receiving a PCB edge connector to electrically couple module 11 to an electronic apparatus are held together by insulative strip 32. Each spring contact 31 has a curved upper portion 33 for engaging a conductor of the PCB edge connector located in the electronic apparatus and a straight lower portion 34 emanating therefrom for connecting contacts 31 to respective conductors on substrate 25.

Figure 3:
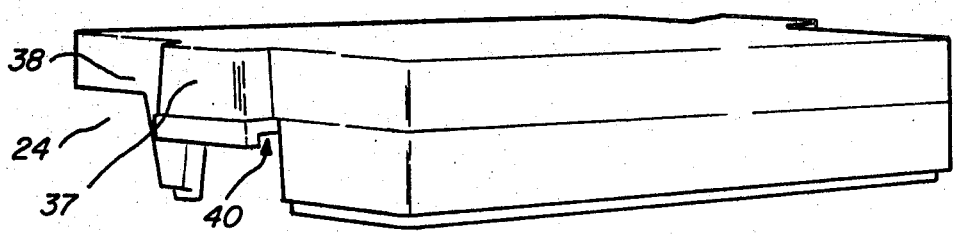
FIG. 3 is a perspective view of the interior of the module of FIG. 1, with the upper portion of the casing removed.
Figure 3:
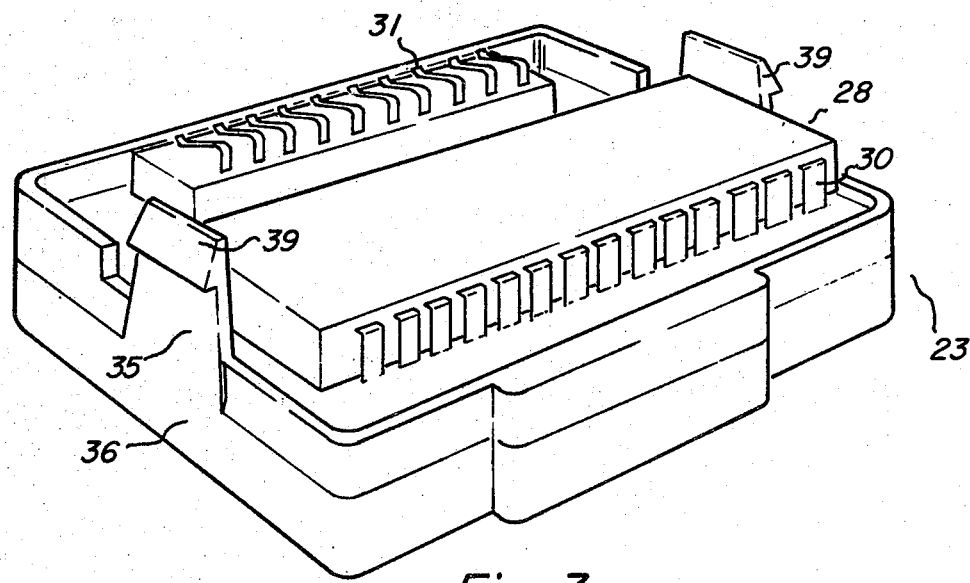

When substrate 25, integrated circuit 28 and spring contacts 31 are positioned within lower housing member 23, as shown in FIG. 3, upper housing member 24 is attached to lower housing member 23 to completely envelop integrated circuit 28 and spring contacts 21 and provide a protective housing. Integrated circuit 28 is not exposed to the exterior of the housing and is thus protected from physical and electrical damage. Lower housing member 23 includes a vertical tab member 35 on each end wall 36 which is inserted into a recess (not shown) within extension member 37 on end wall 38. Outwardly extending lip 39 on tab member 35 engages a ridge surface 40 within extension member 37 to hold lower housing member 23 and upper housing member 24 together in a snap-fit engagement. As illustrated in FIGS. 2 and 3, connection leads 30 extend through openings 26, thereby anchoring integrated circuit 28 to substrate 25. Connection leads 30 are electrically connected to selected electrical conductors on substrate 25. Similarly, straight lower portions 34 of electrical spring contacts 31 extend through openings 27 and are connected to selected conductors on substrate 25. The curved upper portions 33 of contacts 31 are positioned adjacent to elongated slot 21 (FIG. 1a), so as to permit access to spring contacts 31 from the exterior of the housing by a PCB in the electronic apparatus and yet still protect contacts 31 from touching and tampering by a user. Spring contacts 31 are electrically connected to integrated circuit 28 by means of the electrical conductors on substrate 25.

In a preferred embodiment, integrated circuit 28 is comprised of a CMOS chip such as a CMOS read-only memory (ROM) for an electronic spelling device such as described in copending U.S. patent application Ser. No. 901,395 referenced above. FIG. 4 shows the reverse side of electronic spelling device 41. A set of batteries 42 is normally installed in internal receptacle 43 to provide operating power for device 41. Unlike prior art insertable modules, module 11 is installed in device 41 via receptacle 43. An additional compartment to house module 11 is not needed. To install module 11, cover 45 and batteries 42 must first be removed from receptacle 43. The user holds extension member 22 (FIGS. 1a and 1b), inserts module 11 into receptacle 43 and pushes module 11 in the direction A—A', i.e. parallel to major surface 44 of device 41 until module 11 is properly positioned within device 41. When module 11 is properly positioned, the edge connector of PCB 51 extends through slot 21 and engages contacts 31 as shown in FIG. 5. Batteries 42 are then replaced and cover 45 is placed over receptacle 43 to protect the contents thereof. In a further feature, cover 45, when in place, exerts a biasing pressure against module 11 to insure module 11 stays in its proper position. When inserted in electronic spelling device 41, the ROM contained in module 11 provides 150 or more additional spelling words therefor. To remove module 11, cover 45 and batteries 42 are first removed. The user then engages a recess 46 (FIG. 1a) in extension member 22 with a tool or the like and pulls module 11 out of device 41.

The above described arrangements require batteries 42 to be removed and thus power disconnected before module 11 is installed or removed, thereby precluding possible damage to the electronic components thereof from connection or disconnection with power on.

FIG. 5 shows module 11 connected to printed PCB 51 of device 41. When installed, module 11 slides onto PCB 51, which extends through slot 21 and under spring contacts 31. Since slot 21 extends along portions of end walls 17 and 18, module 11 is connectable to a PCB which is of much larger dimensions than module 11. Contacts 31, which are comprised of tin oxide material in one embodiment, engage the edge connector (not shown) on PCB 51 directly to provide a wiping contact therebetween and electrically connect integrated circuit 28 to device 41. The more complicated and expensive technique of bonding electrical contacts such as gold material to PCB 51 to provide an electrical connection is not required. Those skilled in the art will appreciate that module 11 can be connected to PCB 51 in a variety of ways. For example, the edge connector of PCB 51 may be located on the reverse side of PCB 51, requiring PCB 51 to be positioned on top of contacts 31 in order to connect module 11 to device 41. In addition, the module 11 disclosed herein provides an inexpensive and easy way of connecting an integrated circuit to an electronic apparatus such as an electronic learning aid spelling device 41. An additional compartment within the apparatus is not required to house module 11. Further-more, the electronic components contained in module 11 are relatively "child-proof" and unsusceptible to touching and tampering. Installation of module 11 necessitates power being first disconnected, which eliminates the chance of damaging integrated circuit 28.

Preferred embodiments of the module embodying the present invention have now been described in detail. Since it is obvious that many additional changes and modifications can be made in the above-described details without departing from the nature and spirit of the invention, it is understood that the invention is not to be limited to these details except as set forth in the appended claims.

What is claimed is:

1. A modular electronic device comprising:
   (a) housing means of an insulative material defining an internal chamber, said housing means including parallel planar first and second major surfaces, side walls and end walls;
   (b) one of said side walls having an elongated slot of predetermined width extending inwardly along the entire length of the side wall and along adjacent portions of the end walls and communicating with the internal chamber defined by said housing means;
   (c) a side wall oppositely positioned from said elongated slot including an integral projection extending therefrom with an outwardly opening recess for receiving an implement to facilitate removal of said housing means from an installed position within an electronic apparatus; and
   (d) electronic device means mounted within the internal chamber of said housing means and completely enclosed thereby, said electronic device means including electronic circuit means and a plurality of electrical contacts connected to said electronic circuit means for coupling said electronic circuit means to an external apparatus, said contacts being disposed in substantial alignment with the slot in said side wall of said housing means, said electronic circuit means and said plurality of electrical contacts being accessible from the exterior of said housing means only via the slot in said side wall, the width of said slot being sufficiently small so that the electronic circuit means and electrical contacts are not accessible to a human finger or other object of comparable or larger dimensions, thereby preventing wanton contact and tampering with the electronic circuit means and electrical contacts.

2. The device according to claim 1 wherein said electronic circuit means is an integrated circuit packaged in an insulative package with a plurality of leads extending therefrom.

3. The module according to claim 2 wherein said integrated circuit includes a read only memory.

4. The device according to claim 1 further including an insulative substrate mounted within said internal chamber substantially parallel to said first and second major surfaces of said housing means, said electronic circuit means and said plurality of electrical contacts being mounted thereon, said substrate having connector means for electrically coupling said electronic circuit means to said plurality of electrical contacts.

5. The device according to claim 1 wherein said housing means is comprised of first and second housing members having opposed marginal rims disposed in mating engagement to form a polyhedral housing, said first housing member including an extension member integrally formed on each of two end walls thereof, said extension member having a recessed portion therein forming an internal ridge surface extending outwardly from the respective end wall, said second housing member having a vertical tab member integrally formed on each of two end walls thereof, said tab member having a lip extending outwardly therefrom for engaging said internal ridge surface of said first housing member to lock said first and second housing members together.

6. An electronic apparatus comprising:
   (a) a receptacle having an opening therein;
   (b) electrical connector means mounted within said receptacle;
   (c) a modular electronic device interchangeably disposed within said receptacle, said modular electronic device being electrically coupled to said electrical connector means and comprising:
      (i) housing means of an insulative material defining an internal chamber, said housing means including parallel planar first and second major surfaces, side walls and end walls;
      (ii) one of said side walls having an elongated slot formed therein extending inwardly and communicating with the internal chamber defined by said housing means;
      (iii) the opposite side wall having an integral projection extending therefrom into said receptacle, said projection including an outwardly opening recess for receiving an implement to facilitate removal of said modular electronic device from an installed position within the electronic apparatus; and
      (iv) electronic device means mounted within the internal chamber, said electronic device means including electronic circuit means and a plurality of electrical contacts connected to said electronic circuit means and being disposed in substantial alignment with the slot in said side wall, said electrical connector means extending through said slot and engaging said plurality of electrical contacts; and
   (d) power supply means disposed within said receptacle for supplying electrical power to said electronic apparatus, said power supply means being interposed between the electronic module and the opening in said receptacle so as to block insertion or removal of said electronic module into or from said receptacle prior to the removal of said power supply means therefrom.

7. The electronic apparatus according to claim 6 wherein said power supply means is comprised of at least one dry cell battery.

8. The electronic apparatus according to claim 6 wherein said electronic apparatus is an electronic learning aid device.

9. The apparatus according to claim 6 wherein the electronic device means is completely enclosed by said housing means and said electronic circuit means and said electrical contacts are accessible from the exterior of said housing means only via said slot, said slot having a sufficiently small width such that the electronic circuit means and the electrical contacts are not accessible to a human finger or other object of comparable or larger dimensions, thereby preventing wanton touching and tampering with the electronic circuit means and electrical contacts.

* * * * *